(12) United States Patent
Shimada

(10) Patent No.: US 10,635,237 B2
(45) Date of Patent: Apr. 28, 2020

(54) CONTROL CIRCUIT AND CONTROL METHOD FOR TOUCH PANEL, AND TOUCH-TYPE INPUT DEVICE AND ELECTRONIC DEVICE USING THE SAME

(71) Applicant: ROHM CO., LTD., Kyoto (JP)

(72) Inventor: Yuji Shimada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/156,420

(22) Filed: Oct. 10, 2018

(65) Prior Publication Data

US 2019/0107920 A1 Apr. 11, 2019

(30) Foreign Application Priority Data

Oct. 11, 2017 (JP) .................. 2017-197785

(51) Int. Cl.
| | | |
|---|---|---|
| *G06F 3/041* | (2006.01) | |
| *G06F 3/045* | (2006.01) | |
| *H03K 17/96* | (2006.01) | |

(52) U.S. Cl.
CPC ............ *G06F 3/0418* (2013.01); *G06F 3/045* (2013.01); *H03K 17/9645* (2013.01); *G06F 2203/04104* (2013.01)

(58) Field of Classification Search
CPC .................. G06F 3/0418; G06F 3/045; G06F 2203/04104; H03K 17/9645
See application file for complete search history.

(56) References Cited

U.S. PATENT DOCUMENTS

| | | | |
|---|---|---|---|
| 8,390,596 B2 | 3/2013 | Tada | |
| 8,860,673 B2 | 10/2014 | Tada et al. | |
| 2003/0063073 A1* | 4/2003 | Geaghan | G06F 3/0416 345/173 |
| 2007/0165009 A1* | 7/2007 | Sakurai | G06F 3/0412 345/177 |
| 2008/0157782 A1* | 7/2008 | Krah | G01R 31/046 324/538 |
| 2008/0197943 A1* | 8/2008 | Xu | H03H 9/46 333/194 |
| 2008/0252608 A1* | 10/2008 | Geaghan | G06F 3/044 345/173 |
| 2008/0288666 A1* | 11/2008 | Hodges | G06F 13/4095 710/9 |
| 2010/0026639 A1* | 2/2010 | Lee | G06F 3/0412 345/173 |

(Continued)

FOREIGN PATENT DOCUMENTS

JP 2009048233 3/2009

*Primary Examiner* — Sejoon Ahn
(74) *Attorney, Agent, or Firm* — Cantor Colburn LLP

(57) ABSTRACT

There is provided a control circuit configured for a touch panel. The touch panel includes: a first resistive film and a second resistive film installed with a gap between the first resistive film and the second resistive film; and a first terminal and a second terminal that extend from two opposing sides of the first resistive film. The control circuit includes: a driving circuit configured to apply a driving voltage between the first terminal and the second terminal; and a current detection circuit configured to generate a digital current detection value that indicates a current amount obtained by subtracting a predetermined current from a panel current flowing between the first terminal and the second terminal.

11 Claims, 8 Drawing Sheets

(56) References Cited

U.S. PATENT DOCUMENTS

| | | | | |
|---|---|---|---|---|
| 2010/0030505 A1* | 2/2010 | Kvavle | ............. | G05B 23/0256 |
| | | | | 702/85 |
| 2010/0254206 A1* | 10/2010 | Campbell | ................ | G11C 7/12 |
| | | | | 365/203 |
| 2011/0061948 A1* | 3/2011 | Krah | .................... | G06F 3/0418 |
| | | | | 178/18.01 |
| 2014/0375593 A1* | 12/2014 | Singh | .................... | G06F 3/0416 |
| | | | | 345/174 |
| 2015/0212650 A1* | 7/2015 | Noto | .................... | G06F 3/0418 |
| | | | | 345/174 |
| 2017/0343386 A1* | 11/2017 | Tanaka | .................... | G01D 5/24 |

* cited by examiner

CONTROL CIRCUIT AND CONTROL METHOD FOR TOUCH PANEL, AND TOUCH-TYPE INPUT DEVICE AND ELECTRONIC DEVICE USING THE SAME

CROSS-REFERENCE TO RELATED APPLICATION

The present application claims priority under 35 U.S.C § 119(e) to Japanese Patent Application No. 2017-197785, filed on Oct. 11, 2017, the entire contents of which are incorporated herein by reference.

TECHNICAL FIELD

The present disclosure relates to a resistive film-type touch panel.

BACKGROUND

Recent electronic devices such as smart phones, tablet terminals, laptop computers, portable audio devices, digital cameras, and the like have a touch panel (touch sensor) for operating the electronic devices by touching with a finger.

FIG. 1 is a diagram schematically illustrating a resistive film-type touch panel. The resistive film-type touch panel (hereinafter, simply referred to as a "touch panel") 100 has a first resistive film 102, a second resistive film 104, a pair of X electrodes 106, and a pair of Y electrodes 108. For the sake of description, X and Y axes are taken in the direction shown in the illustration. The first resistive film 102 and the second resistive film 104 are arranged to face each other with a gap therebetween. The pair of X electrodes 106 are formed along two opposing sides extending in a Y direction of the first resistive film 102. The pair of Y electrodes 108 are formed along two opposing sides extending in an X direction of the second resistive film 104. Wirings (terminals) XP and XN extend from the pair of X electrodes 106, and wirings YP and YN extend from the pair of Y electrodes 108.

When a user touches at any point (contact point) $P_T$, the first resistive film 102 and the second resistive film 104 contact with each other at the point $P_T$. Contact resistance is indicated by Rc. When detecting the X coordinate, a constant voltage (driving voltage) $V_{DRV}$ is applied between the pair of X electrodes 106, and a potential Vx obtained by dividing the constant voltage $V_{DRV}$ by resistors $Rx_1$ and $Rx_2$ is generated at the contact point $P_T$.

$$Vx = V_{DRV} \times Rx_1/(Rx_1+Rx_2)$$

Since $Rx_1+Rx_2$ is panel impedance (referred to as panel resistance Rx) between the wirings XP and XN and is a value unique to the panel, $Vx = V_{DRV} \times Rx_1/Rx$.

Since the resistance $Rx_1$ has a value corresponding to the X coordinate, the measured voltage Vx indicates the X coordinate. When both the wirings YP and YN are set to high impedance, the potential Vx of the contact point is observed through the second resistive film 104 in the potentials of the wirings YP and YN.

When detecting the Y coordinate, the constant voltage $V_{DRV}$ is similarly applied between the pair of Y electrodes 108, and the potential Vy of the first resistive film 102 is measured.

$$Vy = V_{DRV} \times Ry_1/(Ry_1+Ry_2)$$

Recently, a touch panel compatible with multi-touch has been required. For example, a multi-touch detection technique in a resistive film-type touch panel is provided. FIG. 2 is an equivalent circuit diagram of a touch panel when multi-touch occurs. $Rc_1$ and $Rc_2$ indicate contact resistances, and $Ry_2$ indicates impedance between two points $P_1$ and $P_2$ of the second resistive film 104.

As the distance between the two points $P_1$ and $P_2$ of the multi-touch is longer, the combined impedance of the first resistive film 102 and the second resistive film 104 decreases. Therefore, coordinates of the two points may be detected by detecting the combined impedance Zx. In order to detect the combined impedance Zx, a current (panel current Ix) flowing through the panel is detected. This also applies to the Y coordinate.

The panel current Ix is given by the following equation.

$$Ix = V_{DRV}/Zx$$

$$Zx = Rx_1 + Rx_3 + Rx_2//(Rc_1+Ry_2+Rc_2)$$

The above equation indicates combined resistance of parallel resistors.

$Rx_1+Rx_2+Rx_3=Rx$ is established.

FIG. 3A and FIG. 3B are diagrams illustrating a relationship between a distance Δx between two points and a panel current Ix. Here, this relational equation is schematically indicated by a straight line, but actually, it is a more complicated curve.

The state of one point touch corresponds to zero of a distance Δx between two points. The impedance Zx of the panel when the distance Δx between the two points is zero is $Zx = Rx_1+Rx_2+Rx_3=Rx$, it is equal to that in a non-touch state, and a panel current $Ix_0$ at that time is given by $Ix_0 = V_{DRV}/Rx$.

When the distance Δx between the two points increases, the panel current Ix increases from $Ix_0$. That is, the current $Ix_0$ stably flows irrespective of the presence or absence of touch, and it is referred to herein as a constant current or a constant component.

Recently, the resistance of the resistive film has been reduced and the panel resistance Rx has been reduced. FIG. 3A illustrates a case where the panel resistance Rx is relatively large, and FIG. 3B illustrates a case where the panel resistance Rx is relatively small. The panel current Ix is normalized so that the maximum value becomes the same for easy comparison. As can be seen from the comparison of FIG. 3A and FIG. 3B, as the panel resistance Rx decreases, the sensitivity of the panel current Ix to the change of the distance Δx between the two points decreases.

From another point of view, when the panel current Ix of FIG. 3A and FIG. 3B is quantized with the same current resolution, in FIG. 3B, the effective resolution of a fluctuation component depending on the distance between the two points included in the panel current Ix is significantly reduced. This problem should not be regarded as a general perception of those skilled in the art.

SUMMARY

The present disclosure provides some embodiments of a control circuit capable of detecting a fluctuation component of a current caused by a touch with high accuracy.

According to one embodiment of the present disclosure, there is provided a control circuit configured for a touch panel. In the control circuit, the touch panel includes: a first resistive film and a second resistive film installed with a gap between the first resistive film and the second resistive film; and a first terminal and a second terminal that extend from two opposing sides of the first resistive film. The control circuit includes: a driving circuit configured to apply a driving voltage between the first terminal and the second terminal; and a current detection circuit configured to generate a digital current detection value that indicates a current amount obtained by subtracting a predetermined current from a panel current flowing between the first terminal and the second terminal.

According to the present embodiment, it is possible to remove or reduce a constant component that does not depend on the distance between the two points from the panel current and to use a fluctuation component depending on the distance between the two points as a detection target. This makes it possible to increase the effective detection accuracy for the fluctuation component.

The predetermined current may be set based on the current detection value generated in a non-touch state. In a calibration process, by adjusting the value of the predetermined current so that the current amount indicated by the current detection value approaches zero, it is possible to make the constant component that does not depend on the distance between the two points included in the current detection value close to zero.

The current detection circuit may include: a current copy circuit configured to generate a sense current corresponding to the panel current; a variable current source configured to generate a correction current corresponding to the predetermined current; an I/V (current/voltage) conversion circuit configured to convert a difference between the sense current and the correction current into a sense voltage; and an A/D converter configured to convert the sense voltage into the current detection value.

A gain of the I/V conversion circuit may be adjustable. This makes it possible to effectively use the dynamic range of the A/D converter.

An input range of the A/D converter may be adjustable. Thus, it is possible to reduce the remaining constant component.

The driving circuit may have a push-pull output stage, and the current copy circuit may be further configured to generate a first copy of a current flowing through a high-side transistor of the output stage and a second copy of a current flowing through a low-side transistor of the output stage, and to use a difference between the first copy and the second copy as the sense current. In a configuration in which the driving circuit sources (discharges) the panel current, most of the panel current flows through the high-side transistor, but an idle current that cannot be ignored may flow through the low-side transistor. With this configuration, it is possible to accurately detect the panel current by removing the influence of the idle current of the output stage.

The I/V conversion circuit may include a transimpedance amplifier configured to receive the driving voltage by a first input and receive a difference between the sense current and the correction current by a second input.

The control circuit may be integrated on a single semiconductor substrate. The term "integrated" may include a case where all the components of a circuit are formed on a semiconductor substrate or a case where the main components of a circuit are integrated, and some resistors, capacitors, or the like may be installed outside the semiconductor substrate in order to adjust circuit constants. By integrating the circuit on one chip, it is possible to reduce the circuit area and to keep the characteristics of the circuit elements uniform.

According to another embodiment of the present disclosure, there is provided a touch-type input device. The touch-type input device may include a touch panel; and the control circuit connected to the touch panel.

According to further another embodiment of the present disclosure, there is provided an electronic device. The electronic device may include the touch-type input device.

Further, arbitrarily combining the foregoing components or substituting the expressions of the present disclosure with each other between a method and an apparatus is also effective as an embodiment of the present disclosure.

DETAILED DESCRIPTION

Figure 1:
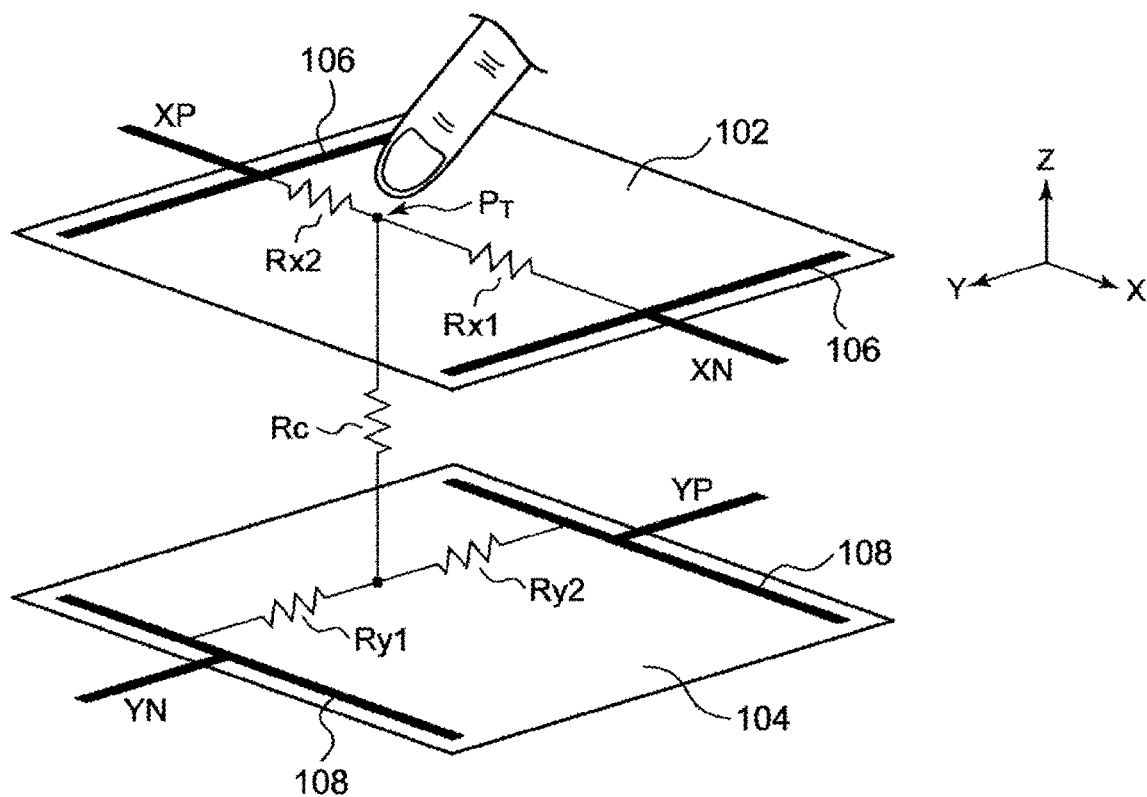
FIG. 1 is a diagram schematically illustrating a resistive film-type touch panel.
Figure 2:
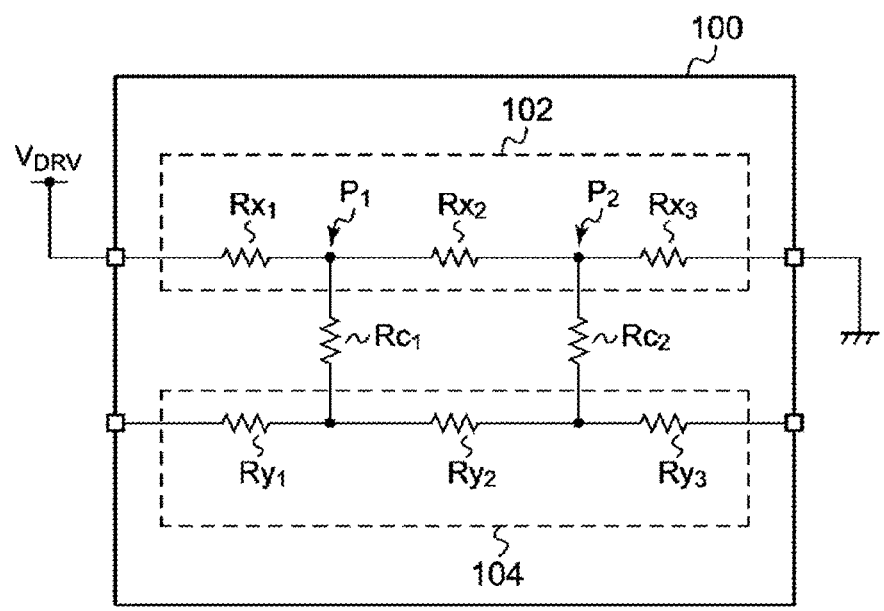
FIG. 2 is an equivalent circuit diagram of a touch panel when multi-touch occurs.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not substantially affect an electrical connection state between the member A and C or the member B and the member C or does not impair functions and effects achieved by combinations of the members A and C or the members B and C, in addition to a case where the member A and the member C or the member B and the member C are directly connected.

Figure 4:
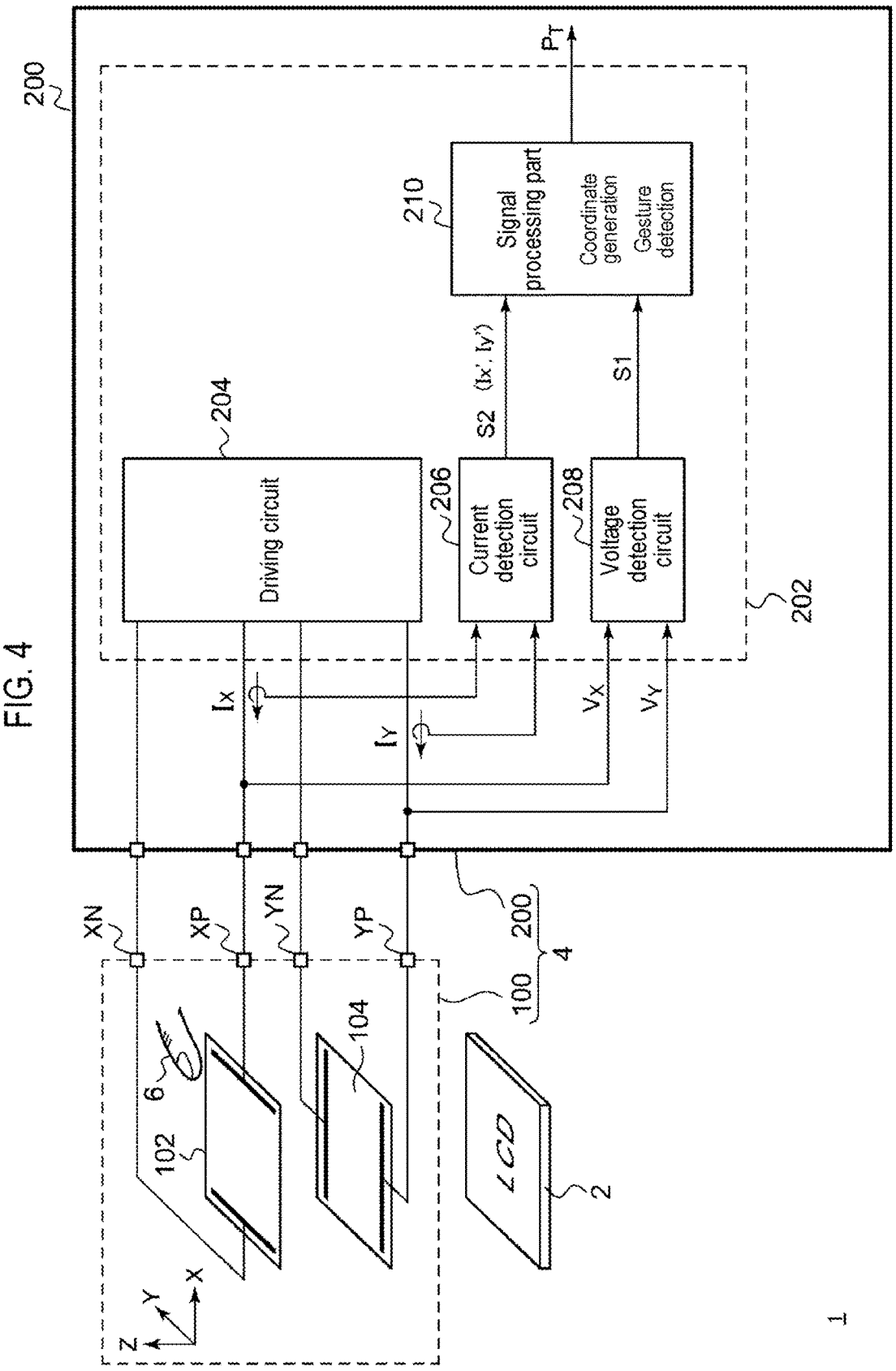
FIG. 4 is a block diagram of an electronic device including a touch-type input device according to an embodiment of the present disclosure.

FIG. 4 is a block diagram of an electronic device 1 including a touch-type input device 4 according to an embodiment of the present disclosure. The electronic device 1 is a smart phone, a tablet terminal, a notebook PC, a portable audio player, a digital camera, a digital video camera, or the like, and includes a display panel 2 having a liquid crystal display (LCD) panel or an organic EL panel. The touch-type input device 4 is mounted on the electronic device 1 together with the display panel 2.

The touch-type input device 4 includes a touch panel 100 and a control circuit 200. The touch panel 100 is arranged on a surface layer of the display panel 2 and functions as a touch-type input device. The touch-type input device 4 determines an X coordinate and a Y coordinate of a point touched by a user with a finger, a pen or the like (hereinafter, referred to as a finger 6). The touch panel 100 is a four-wire (four-terminal) resistive film type, and the configuration thereof is as described with reference to FIG. 1.

The touch panel 100 includes a first resistive film 102, a second resistive film 104, a first terminal XP, a second terminal XN, a third terminal YP, and a fourth terminal YN. The first resistive film 102 and the second resistive film 104 are arranged so as to overlap each other with a gap in a Z axis direction perpendicular to an X axis and a Y axis. Two sides extending in the Y axis direction of the first resistive film 102 are connected to the first terminal XP and the second terminal XN. Two sides extending in the X axis direction of the second resistive film 104 are connected to the third terminal YP and the fourth terminal YN.

The touch-type input device 4 supports input of single touch touched by the user at one point and multi-touch touched by the user at two points (or three or more points). The control circuit 200 is connected to the first terminal XP to the fourth terminal YN of the touch-type input device 4 and detects an X coordinate and a Y coordinate of a point touched by the user.

The control circuit 200 includes a coordinate detection circuit 202, and is a functional integrated circuit (IC) integrated on one semiconductor substrate. The coordinate detection circuit 202 applies an appropriate electrical signal to the touch panel 100 and detects coordinates (or gesture input) based on the presence or absence of touch and an electrical change occurring in the touch panel 100 according to touched coordinates. The coordinate detection circuit 202 mainly operates in the following four modes.

φ1. Single touch (one point touch), X coordinate detection mode
φ2. Single touch, Y coordinate detection mode
φ3. Multi-touch, X coordinate detection mode
φ4. Multi-touch, Y coordinate detection mode The coordinate detection circuit 202 includes a driving circuit 204, a current detection circuit 206, a voltage detection circuit 208, and a signal processing part 210. A part or the whole of the processing of the signal processing part 210 may be entrusted to a processor installed outside the control circuit 200.

The functions of the driving circuit 204, the current detection circuit 206, and the voltage detection circuit 208 in each mode will be described.

(Single Touch Detection)

Figure 5:
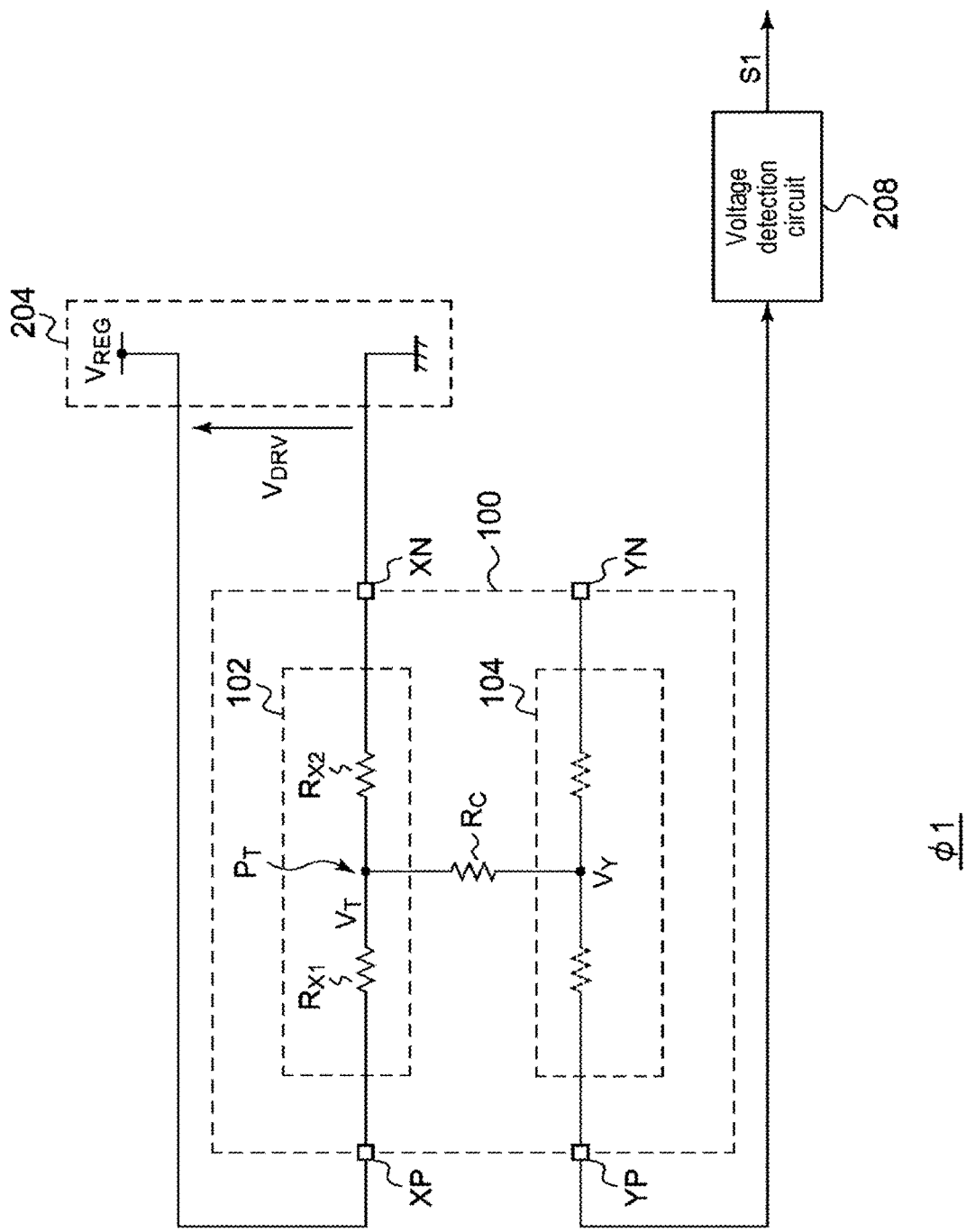
FIG. 5 is a diagram illustrating the principle of detecting an X coordinate at the time of single touch.

FIG. 5 is a diagram illustrating the principle of detecting an X coordinate at the time of single touch. In the mode φ1, the driving circuit 204 applies a driving voltage (bias voltage) $V_{DRV}$ between the first terminal XP and the second terminal XN. For example, the driving circuit 204 may supply a constant voltage $V_{REG}$ corresponding to the driving voltage $V_{DRV}$ to the first terminal XP, and may ground the second terminal XN.

In this state, when the user touches a certain coordinate $P_T$ at one point, a potential $V_T$ of the coordinate $P_T$ is given by the following equation (1).

$$V_T = V_{REG} \times Rx_2/(Rx_1 + Rx_2) = V_{REG} \times Rx_2/Rx \qquad \text{Eq. (1)}$$

$Rx = Rx_1 + Rx_2$ indicates impedance between the first terminal XP and the second terminal XN when not touched, i.e., a resistance value of the first resistive film 102. $Rx_2$ is dependent on a distance between XN and $P_T$. When the second terminal XN is set to X=0, $Rx_2$ is proportional to the X coordinate (a distance X from XN). If the distance between XP and XN is $X_{MAX}$, it is represented by:

$$Rx_2 = Rx/X_{MAX} \times X \qquad \text{Eq. (2)}$$

Substituting Eq. (2) for Eq. (1) yields Eq. (3).

$$V_T = V_{REG} \times X/X_{MAX} \qquad \text{Eq. (3)}$$

That is, the potential $V_T$ of the $P_T$ when the point $P_T$ is touched indicates the X coordinate.

In the mode φ1, the third terminal YP and the fourth terminal YN are set to high impedance. Therefore, no current flows through the second resistive film 104 and the contact resistance $R_C$, the potential difference also becomes zero, and the potential $V_T$ at the point $P_T$ appears at the third terminal YP and the fourth terminal YN. The voltage detection circuit 208 measures a voltage $V_Y$ (=$V_T$) of the third terminal YP (or the fourth terminal YN), and generates a digital voltage detection value S1 indicating the voltage $V_Y$. The signal processing part 210 generates an X coordinate of the point $P_T$ based on the voltage detection value S1 (voltage $V_Y$).

In the mode φ2, a Y coordinate of the point $P_T$ is detected by replacing the first resistive film 102 and the second resistive film 104 and performing the same measurement. Specifically, the driving circuit 204 applies a driving voltage $V_{DRV}$ between the third terminal YP and the fourth terminal YN, and the voltage detection circuit 208 measures a voltage $V_X$ of the first terminal XP (or the fourth terminal YN) at that time. The signal processing part 210 generates a Y coordinate of the point $P_T$ based on the voltage detection value S1 (voltage $V_X$).

(Multi-Touch Detection)

Figure 6:
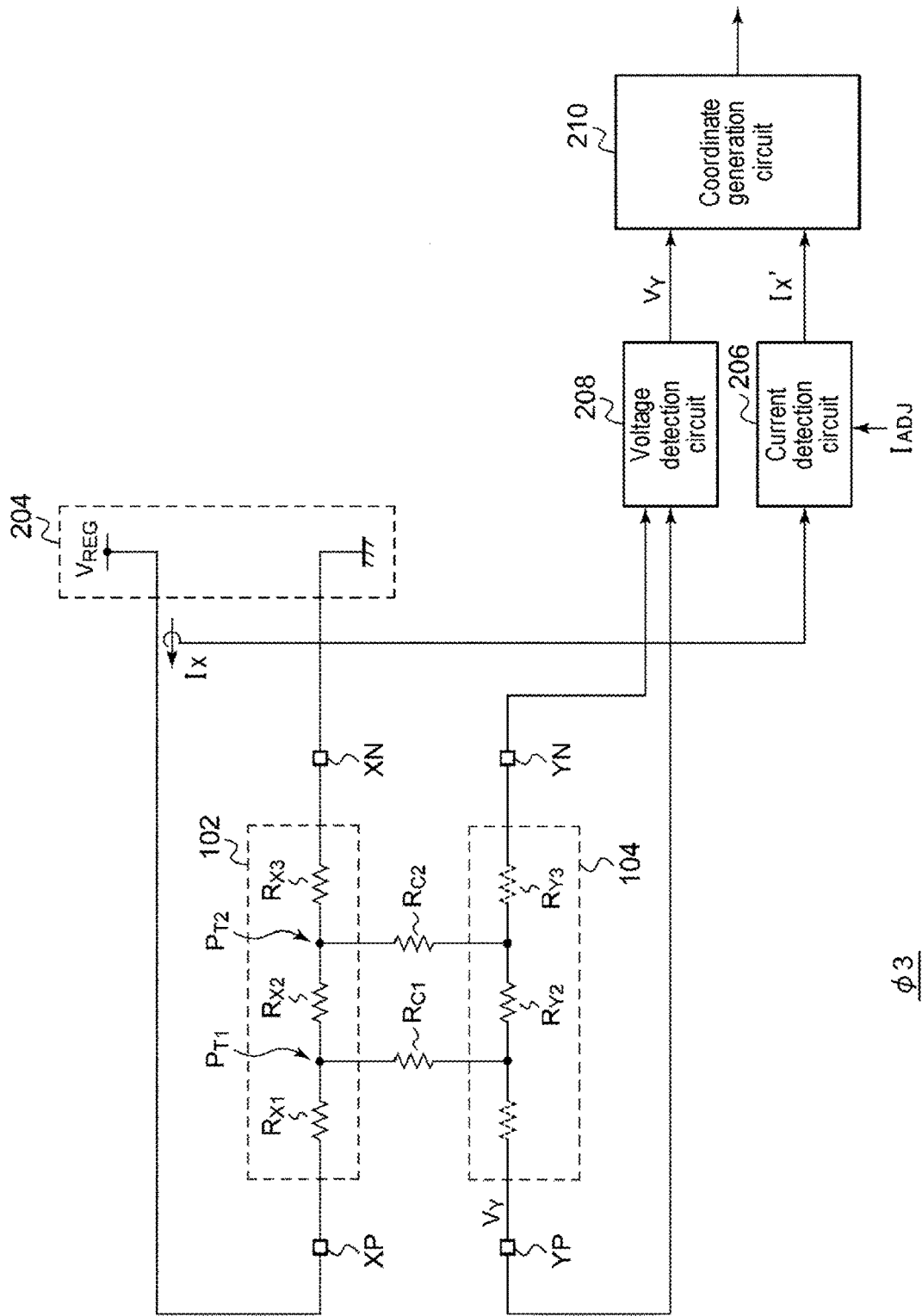
FIG. 6 is a diagram illustrating the principle of detecting X coordinates at the time of multi-touch.

FIG. 6 is a diagram illustrating the principle of detecting X coordinates at the time of multi-touch. In the mode φ3, similar to the mode φ1, the driving circuit 204 applies a driving voltage $V_{DRV}$ between the first terminal XP and the second terminal XN. Also in the mode φ3, the third terminal YP and the fourth terminal YN are set to high impedance, and the voltage detection circuit 208 measures a voltage $V_Y$ of the third terminal YP (and/or the fourth terminal YN) and generates a voltage detection value S1.

In this state, when the user touches certain two points $P_{T1}$ and $P_{T2}$, the voltage $V_Y$ has a potential corresponding to the two points $P_{T1}$ and $P_{T2}$. For example, it may be configured such that the voltage $V_Y$ indicates a midpoint between the two points $P_{T1}$ and $P_{T2}$.

The current detection circuit 206 generates a digital current detection value S2 corresponding to a panel current Ix flowing between the first terminal XP and the second terminal XN. In the present embodiment, the current detection value S2 is not the panel current Ix itself but a current amount $Ix' (= Ix - I_{ADJ})$ obtained by subtracting a predetermined current $I_{ADJ}$ from the panel current Ix. It should be noted that the process of subtracting the current $I_{ADJ}$ is performed not in the digital domain but in the previous analog domain.

Figure 3A:
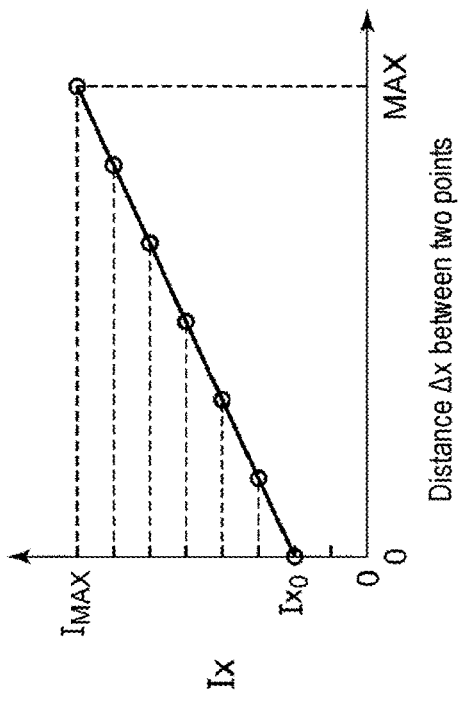
FIG. 3A and FIG. 3B are diagrams illustrating a relationship between a distance $\Delta x$ between two points and a panel current Ix.
Figure 3B:
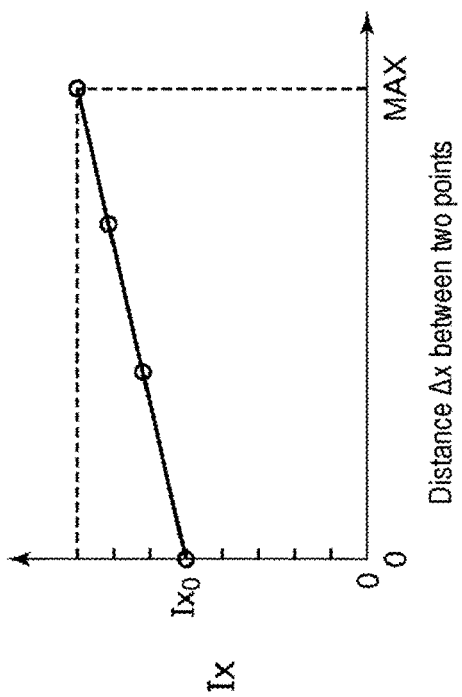

The predetermined current $I_{ADJ}$ is determined by calibration as described hereinbelow. It is preferable to adjust the current $I_{ADJ}$ so that the current Ix' after subtracting the current $I_{ADJ}$ is substantially zero in a single touch state (or a non-touch state) where the distance Δx between the two points is zero. In other words, it is preferable that the current $I_{ADJ}$ substantially coincides with the constant component $Ix_0$ described with reference to FIG. 3A and FIG. 3B.

The signal processing part 210 generates X coordinates (i.e., X1 and X2) of the two points $P_{T1}$ and $P_{T2}$ based on the voltage detection value S1 (voltage $V_Y$) and the current detection value S2 (current Ix').

In the mode φ4, Y coordinates of the two points $P_{T1}$ and $P_{T2}$ are detected by replacing the first resistive film 102 and the second resistive film 104 and performing the same measurement. Specifically, the driving circuit 204 applies a driving voltage $V_{DRV}$ between the third terminal YP and the fourth terminal YN. The voltage detection circuit 208 measures a voltage $V_X$ of the first terminal XP (or the fourth terminal YN) at that time, and the current detection circuit 206 measures a panel current Iy flowing between the third terminal YP and the fourth terminal YN. The signal processing part 210 generates Y coordinates (i.e., Y1 and Y2) of the two points $P_{T1}$ and $P_{T2}$ based on the voltage detection value S1 (voltage $V_X$) and the current detection value S2 (current Iy').

The configuration of the control circuit 200 has been described above. Next, advantages of the control circuit 200 will be described.

Figure 7A:
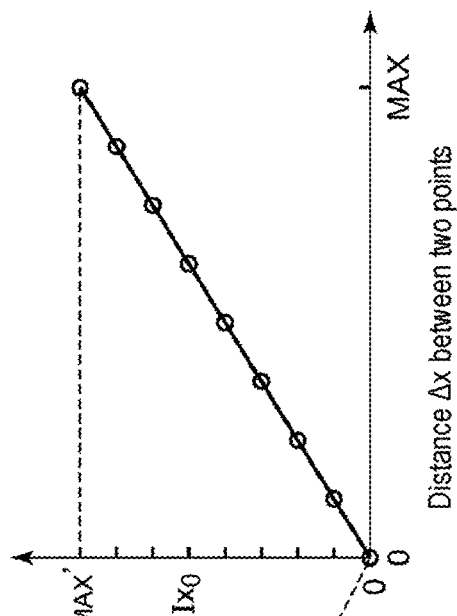
FIG. 7A and FIG. 7B are diagrams illustrating signal processing in a control circuit.
Figure 7B:
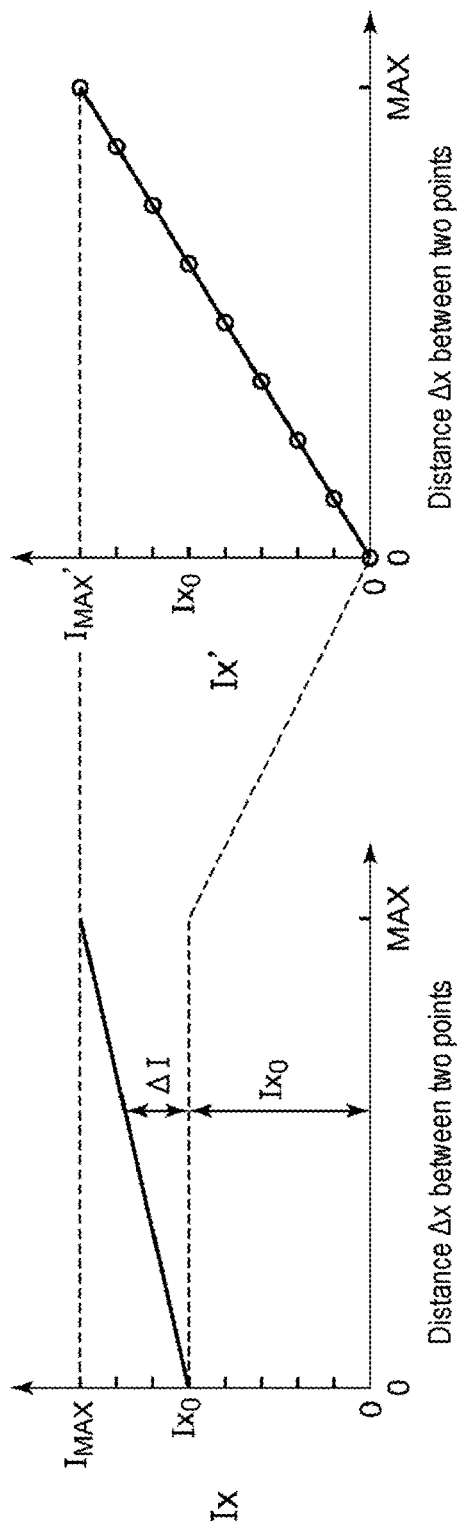

FIG. 7A and FIG. 7B are diagrams illustrating signal processing in the control circuit 200. As illustrated in FIG. 7A, the panel current Ix may be decomposed into a constant component $Ix_0$ that does not depend on the distance Δx between the two points and a fluctuation component ΔI depending on the distance Δx between the two points. The current detection circuit 206 uses a current Ix' corresponding to the fluctuation component ΔI as a detection target. Specifically, the fluctuation component ΔI is extracted by subtracting the predetermined current $I_{ADJ}$ corresponding to the constant component $Ix_0$ from the panel current Ix.

Then, as illustrated in FIG. 7B, a quantization process is performed on the fluctuation component ΔI. As a result, even when the constant component $Ix_0$ is large and the fluctuation component ΔI is relatively small, the latter can be detected with high resolution. Accordingly, it is possible to improve the detection accuracy of the distance Δx between the two points.

The present disclosure is recognized by the block diagram and the circuit diagram of FIG. 4, and encompasses various devices and circuits derived from the above description and is not limited to a specific configuration. Hereinafter, a more specific configuration example and modifications will be described in order to facilitate and clarify understanding of the essence and circuitry operation of the disclosure, rather than to narrow the scope of the present disclosure.

Figure 8:
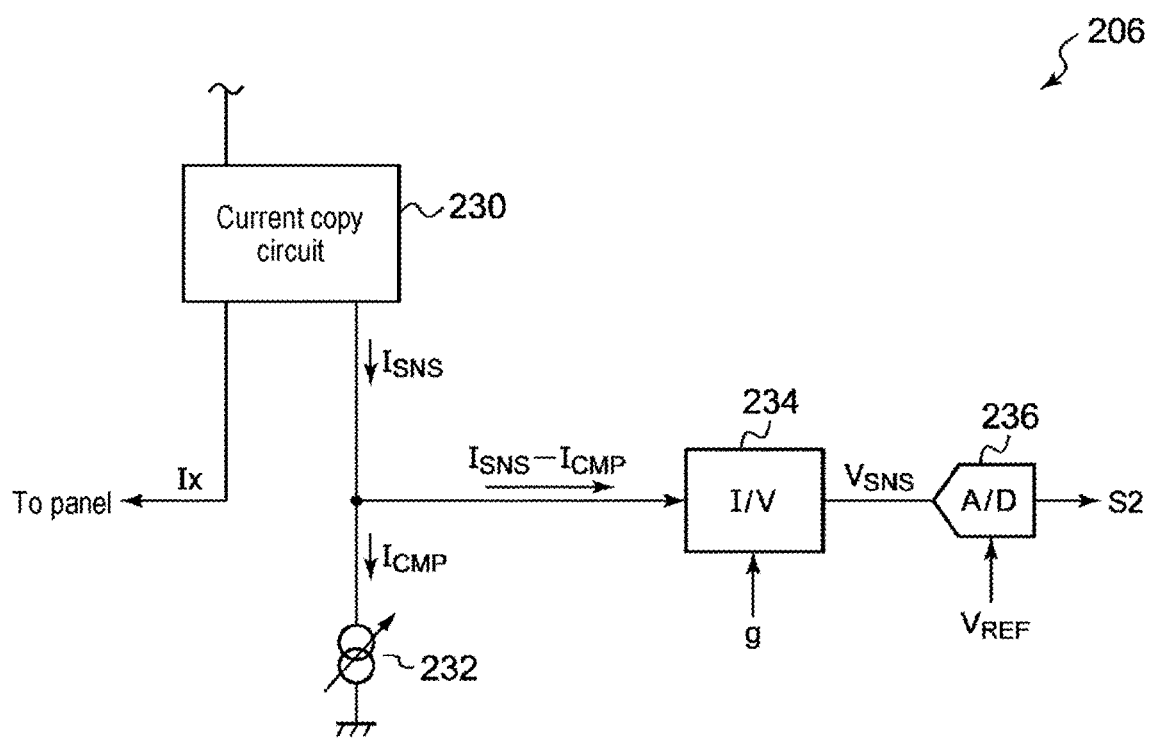
FIG. 8 is a circuit diagram of a current detection circuit according to one example of the present disclosure.

FIG. 8 is a circuit diagram of the current detection circuit 206 according to one example of the present disclosure. The current detection circuit 206 includes a current copy circuit 230, a variable current source 232, an I/V conversion circuit 234, and an A/D converter 236.

The current copy circuit 230 generates a sense current $I_{SNS}$ corresponding to the panel current Ix. The sense current $I_{SNS}$ is a replica of the panel current Ix. The variable current source 232 generates a correction current $I_{CMP}$ corresponding to the predetermined current $I_{ADJ}$. When the sense current $I_{SNS}$ is 1/K times the panel current Ix, the correction current $I_{CMP}$ is also 1/K times the predetermined current $I_{ADJ}$. The variable current source 232 may use a current DAC, but is not limited thereto. The current copy circuit 230 may be configured by a current mirror circuit.

The I/V conversion circuit 234 converts a difference ($I_{SNS}-I_{CMP}$) between the sense current $I_{SNS}$ and the correction current Icy into a sense voltage $V_{SNS}$. The A/D converter 236 quantizes the sense voltage $V_{SNS}$ and converts it into a current detection value S2.

The I/V conversion circuit 234 is configured to have a variable gain. In addition, the A/D converter 236 is configured so that its input range is variable. The input range of the A/D converter 236 may vary according to a reference voltage $V_{REF}$.

Figure 9:
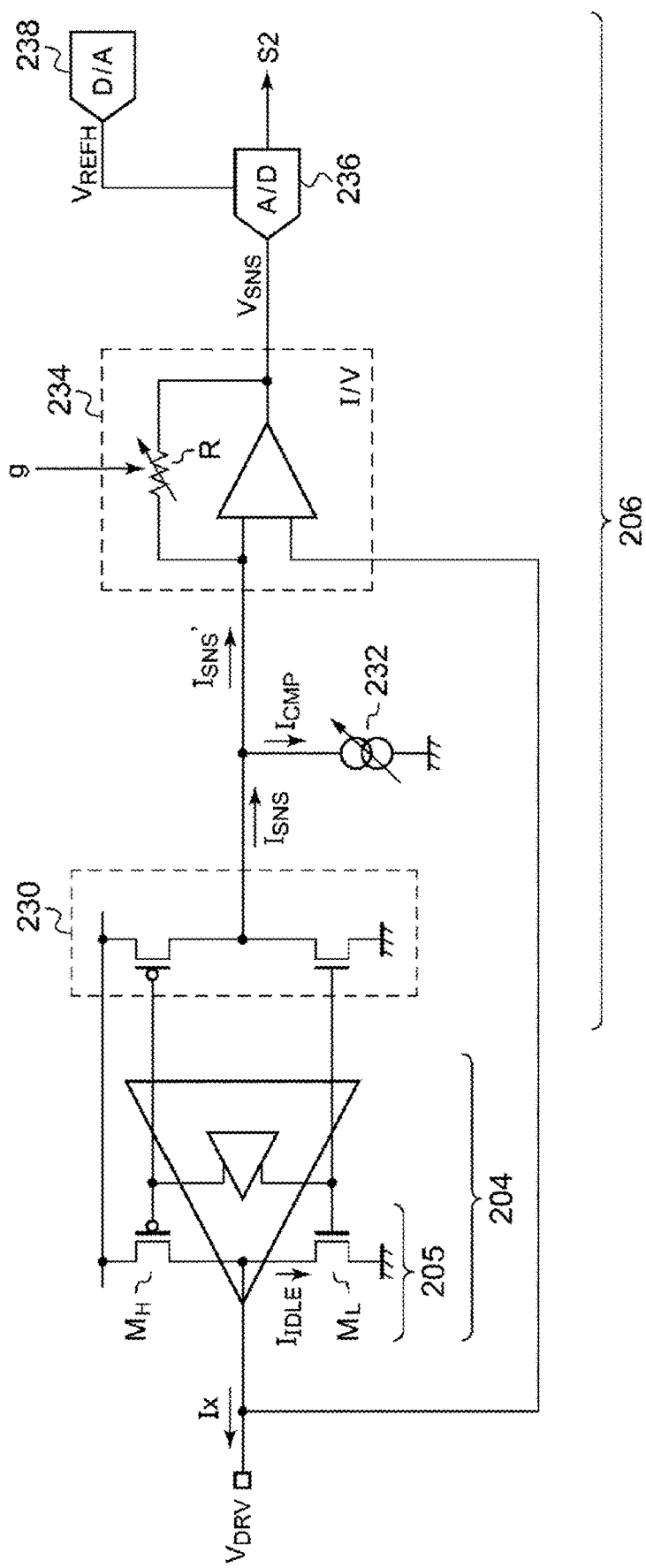
FIG. 9 is a circuit diagram illustrating a specific configuration example of the current detection circuit in FIG. 8.

FIG. 9 is a circuit diagram illustrating a specific configuration example of the current detection circuit 206 in FIG. 8.

The current copy circuit 230 includes transistors forming a current mirror circuit together with transistors of an output stage 205 of the driving circuit 204. The output stage 205 has a push-pull type and includes a high-side transistor $M_H$ and a low-side transistor $M_L$. The current copy circuit 230 generates a copy of a current flowing through each of the high-side transistor $M_H$ and the low-side transistor $M_L$ (i.e., a mirrored current of a current flowing through each of the high-side transistor $M_H$ and the low-side transistor $M_L$), and uses a difference between them as the sense current $I_{SNS}$.

In a configuration in which the driving circuit 204 sources (discharges) the panel current Ix, most of the panel current Ix flows through the high-side transistor $M_H$, but there may be a case where the idle current $I_{IDLE}$ that cannot be ignored also flows through the low-side transistor $M_L$. With this configuration, it is possible to accurately detect the panel current Ix by removing the influence of the idle current $I_{IDLE}$ of the output stage 205.

The I/V conversion circuit 234 includes a transimpedance amplifier. The driving voltage $V_{DRV}$ is input to one input of the transimpedance amplifier, and a difference $I_{SNS}'$ between the sense current $I_{SNS}$ and the correction current $I_{CMP}$ is supplied to the other input thereof. The output (sense voltage) $V_{SNS}$ of the I/V conversion circuit 234 may be expressed by the following equation.

$$V_{SNS}=V_{DRV}-R\times(I_{SNS}-I_{CMP})$$

Resistance R of the transimpedance amplifier is variable resistance, and this resistance value corresponds to a gain g of the I/V conversion circuit 234.

In order to adjust the input range of the A/D converter 236, a variable voltage source 238 for generating an upper reference voltage $V_{REFH}$ of the A/D converter 236 is installed. The variable voltage source 238 may be configured by, for example, a D/A converter.

The configuration of the current detection circuit 206 has been described above. Next, the calibration of the current detection circuit 206 will be described.

A calibration process is performed before the release of the control circuit 200. In the calibration process, the predetermined current $I_{ADJ}$, namely the correction current $I_{CMP}$, and other parameters are optimized.

First, in the non-touch state, an initial value $S2_{INIT}$ of the current detection value S2 is acquired in a state in which the correction current $I_{CMP}$ is initialized (for example, zero). This initial value $S2_{INIT}$ indicates the constant component $Ix_0$. Therefore, the correction current $I_{CMP}$ may be calculated based on the initial value $S2_{INIT}$ so that the constant component $Ix_0$ cancels out. The correction current $I_{CMP}$ may be determined so that the constant component slightly remains.

Furthermore, if it is difficult to obtain an amount of optimum correction current $I_{CMP}$ by one measurement, the optimum correction current $I_{CMP}$ may be determined while increasing the correction current $I_{CMP}$.

In addition, due to the IC process variation, the actually generated correction current may contain an error and may not match the ideal current amount corresponding to the set value. In this case, the error of the correction current may be measured in the first correction, and the setting value of the correction current $I_{CMP}$ may be modified so that the correction current $I_{CMP}$ may be matched in the second correction in consideration of the error.

When the correction current $I_{CMP}$ is set, the gain of the I/V conversion circuit 234 is subsequently optimized.

The sense voltage $V_{SNS}$ when the constant component remains in the sense current $I_{SNS}'$ after correction by the correction current Icy may be expressed by the following equation.

$$V_{SNS} = V_{DRV} - R \times (I_{FIX} + I_{VAR})$$

By adjusting the upper reference voltage $V_{REFH}$ and making the upper limit of the input range of the A/D converter 236 closer to $V_{DRV} - R \times I_{FIX}$, it is possible to remove the influence of the constant component $I_{FIX}$.

The present disclosure has been described above based on the embodiment. It is to be understood by those skilled in the art that the embodiment is merely illustrative and may be differently modified by any combination of the components or processes thereof, and the modifications are also within the scope of the present disclosure. Hereinafter, these modifications will be described.

In the embodiment, the corrected panel current Ix' has been described as being calibrated so as not to substantially contain the constant component $Ix_0$, but the present disclosure is not limited thereto and the constant component $Ix_0$ is reduced even a little and the effects of the present disclosure can be achieved as long as the ratio of the fluctuation component ΔI increases.

In the embodiment, the I/V conversion circuit 234 is not limited to a configuration using a transimpedance amplifier. For example, a conversion resistor whose one end is grounded may be arranged in the path of the corrected sense current $I_{SNS}'$ and the sense voltage $V_{SNS}$ may be generated based on the voltage of the other end of the conversion resistor.

In the embodiment, it is configured such that the current is detected on the high potential side (XP, YP), namely the source side, of the driving circuit 204, but the present disclosure is not limited thereto and the current may be detected on the low potential side (XN, YN), namely the sink side.

According to the present disclosure in some embodiments, it is possible to detect a fluctuation component of current caused by multi-touch with high accuracy.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A control circuit configured for a touch panel including a first resistive film, a second resistive film with a gap formed between the first resistive film and the second resistive film, and a first terminal and a second terminal that extend from two opposing sides of the first resistive film, control circuit comprising:
    a driving circuit configured to apply a driving voltage between the first terminal and the second terminal;
    a sense current generator configured to generate a sense current corresponding to a panel current flowing between the first terminal and the second terminal;
    a subtraction circuit configured to subtract a predetermined current from the sense current to generate a corrected sense current in which a ratio of a fluctuation component to a constant component is increased for higher resolution of the fluctuation component upon quantization;
    an analog amplification circuit configured to convert the corrected sense current into a current detection value for the quantization; and
    a quantization circuit configured to quantize the current detection value.

2. The control circuit of claim 1, wherein the predetermined current is set based on the sense current generated in a non-touch state.

3. The control circuit of claim 1, wherein the sense current generator includes a current copy circuit configured to generate the sense current corresponding to the panel current,
    wherein the subtraction circuit includes a variable current source configured to generate a correction current corresponding to the predetermined current,
    wherein the analog amplification circuit includes an I/V conversion circuit configured to convert the corrected sense current into a sense voltage as the current detection value, and
    wherein the quantization circuit includes an A/D converter configured to convert the sense voltage into a digital current detection value.

4. The control circuit of claim 3, wherein a gain of the I/V conversion circuit is adjustable.

5. The control circuit of claim 3, wherein an input range of the A/D converter is adjustable.

6. A control circuit, for a touch panel,
    wherein the touch panel comprises:
        a first resistive film and a second resistive film installed with a gap between the first resistive film and the second resistive film; and
        a first terminal and a second terminal that extend from two opposing sides of the first resistive film,
    wherein the control circuit comprises:
        a driving circuit configured to apply a driving voltage between the first terminal and the second terminal;
        a panel current detector configured to detect a panel sense current flowing between the first terminal and the second terminal; and
        a current detection circuit configured to generate a digital current detection value that indicates a current amount obtained by subtracting a predetermined current from the panel current,
    wherein the current detection circuit includes:
        a current copy circuit configured to generate a sense current corresponding to the panel current;
        a variable current source configured to generate a correction current corresponding to the predetermined current;
        an I/V conversion circuit configured to convert a difference between the sense current and the correction current into a sense voltage; and an A/D converter configured to convert the sense voltage into the current detection value, wherein the driving circuit has a push-pull output stage, and wherein the current copy circuit is further configured to generate a first copy of a current flowing through a high-side transistor of the output stage and a second copy of a current flowing through a low-side transistor of the output stage, and to use a difference between the first copy and the second copy as the sense current.

7. The control circuit of claim 3, wherein the I/V conversion circuit includes a transimpedance amplifier configured to receive the driving voltage by a first input and receive a difference between the sense current and the correction current by a second input.

8. The control circuit of claim 1, wherein the control circuit is integrated on a single semiconductor substrate.

9. A method of controlling a touch panel including a first resistive film, a second resistive film with a gap formed between the first resistive film and the second resistive film, and a first terminal and a second terminal that extend from two opposing sides of the first resistive film, the method comprising:

applying a driving voltage between the first terminal and the second terminal;

generating a sense current corresponding to a panel current flowing through the first terminal and the second terminal;

subtracting a predetermined current from the sense current to generate a corrected sense current in which a ratio of a fluctuation component to a constant component is increased for higher resolution of the fluctuation component upon quantization;

converting the corrected sense current into a current detection value;

quantizing the current detection value; and detecting multi-touch based on the quantized current detection value.

10. The method of claim 9, further comprising determining the predetermined current based on the panel current in a non-touch state in a calibration process prior to detecting the multi-touch.

11. The method of claim 9, wherein quantizing the current detection value includes converting the current detection value into a digital current detection value by an A/D converter, and wherein the method further comprises optimizing a measurement range of the A/D converter in a calibration process prior to detecting the multi-touch.

* * * * *